US009269409B2

(12) United States Patent
Bajkowski et al.

(10) Patent No.: US 9,269,409 B2
(45) Date of Patent: Feb. 23, 2016

(54) BIT CELL WRITE-ASSISTANCE

(75) Inventors: Maciej Bajkowski, Austin, TX (US); Giao N. Pham, Austin, TX (US); Novat S. Nintunze, Portland, OR (US); Hung C. Ngo, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 192 days.

(21) Appl. No.: 13/995,434

(22) PCT Filed: Oct. 18, 2011

(86) PCT No.: PCT/US2011/056751
§ 371 (c)(1),
(2), (4) Date: Jun. 18, 2013

(87) PCT Pub. No.: WO2013/058743
PCT Pub. Date: Apr. 25, 2013

(65) Prior Publication Data
US 2013/0268737 A1    Oct. 10, 2013

(51) Int. Cl.
*G11C 7/12* (2006.01)
*G11C 7/00* (2006.01)
*G11C 11/419* (2006.01)
*G06F 12/00* (2006.01)

(52) U.S. Cl.
CPC ........ *G11C 7/00* (2013.01); *G06F 12/00* (2013.01); *G11C 7/12* (2013.01); *G11C 11/419* (2013.01)

(58) Field of Classification Search
CPC .............................. G11C 7/12; G11C 11/419
See application file for complete search history.

(56) References Cited

U.S. PATENT DOCUMENTS

| 5,771,190 A | 6/1998 | Okamura |
| 5,991,192 A * | 11/1999 | Wang et al. ............... 365/154 |
| 6,147,898 A | 11/2000 | Yamada |
| 2008/0037337 A1 | 2/2008 | Suzuki et al. |

(Continued)

FOREIGN PATENT DOCUMENTS

WO    2013058743 A1    4/2013

OTHER PUBLICATIONS

International Preliminary Report on Patentability and Written Opinion received for PCT PAtent Application No. PCT/US2011/056751, mailed on May 1, 2014, 8 pages.
International Search Report and Written Opinion received for International Application No. PCT/US2011/056751, mailed Apr. 26, 2012, 11 pages.

*Primary Examiner* — Kevin Verbrugge
*Assistant Examiner* — Rocio Del Mar Perez-Velez
(74) *Attorney, Agent, or Firm* — Garrett IP, LLC (57) ABSTRACT

Methods and systems to provide bit cell write-assist, including equalization of voltages of Bit and $\overline{\text{Bit}}$ nodes of a bit cell prior to a write operation. Equalization may be performed with a pulse-controlled transistor to transfer charge between the storage nodes. Pulse width and/or amplitude may be configurable, such as to scale with voltage. Bit cell write-assist may include reduction of bit cell retention strength during equalization, which may be continued during a write operation. Write-assist may be provided to each of multiple bit cells when a write operation is directed to a subset of the bit cells, which may conserve power and/or area. A partially-decoded address may be used to provide write-assistance to multiple bit cells prior to a write operation. Write-assistance may permit writing of Bit and $\overline{\text{Bit}}$ with a voltage swing significantly lower than an operating voltage of the bit cell.

19 Claims, 9 Drawing Sheets

(56) References Cited

U.S. PATENT DOCUMENTS

2009/0059705 A1 3/2009 Wong
2009/0059706 A1 3/2009 Wong
2010/0315889 A1* 12/2010 Thomas et al. ........ 365/189.011

* cited by examiner

BIT CELL WRITE-ASSISTANCE

BACKGROUND

A memory system may include an array of bit cells, each to store a data bit or logic state. A bit cell may include retention circuitry to assert opposing logic states at first and second storage nodes.

A bit cell may be characterized with respect to a time to perform a write operation, referred to herein as a write response time. Write response time may be slowed by contention between write circuitry and retention circuitry of the bit cell, which may be exacerbated at lower operating voltages, and which may reduce a frequency at which write operations may be performed.

In the drawings, the leftmost digit(s) of a reference number identifies the drawing in which the reference number first appears.

DETAILED DESCRIPTION

Figure 1:
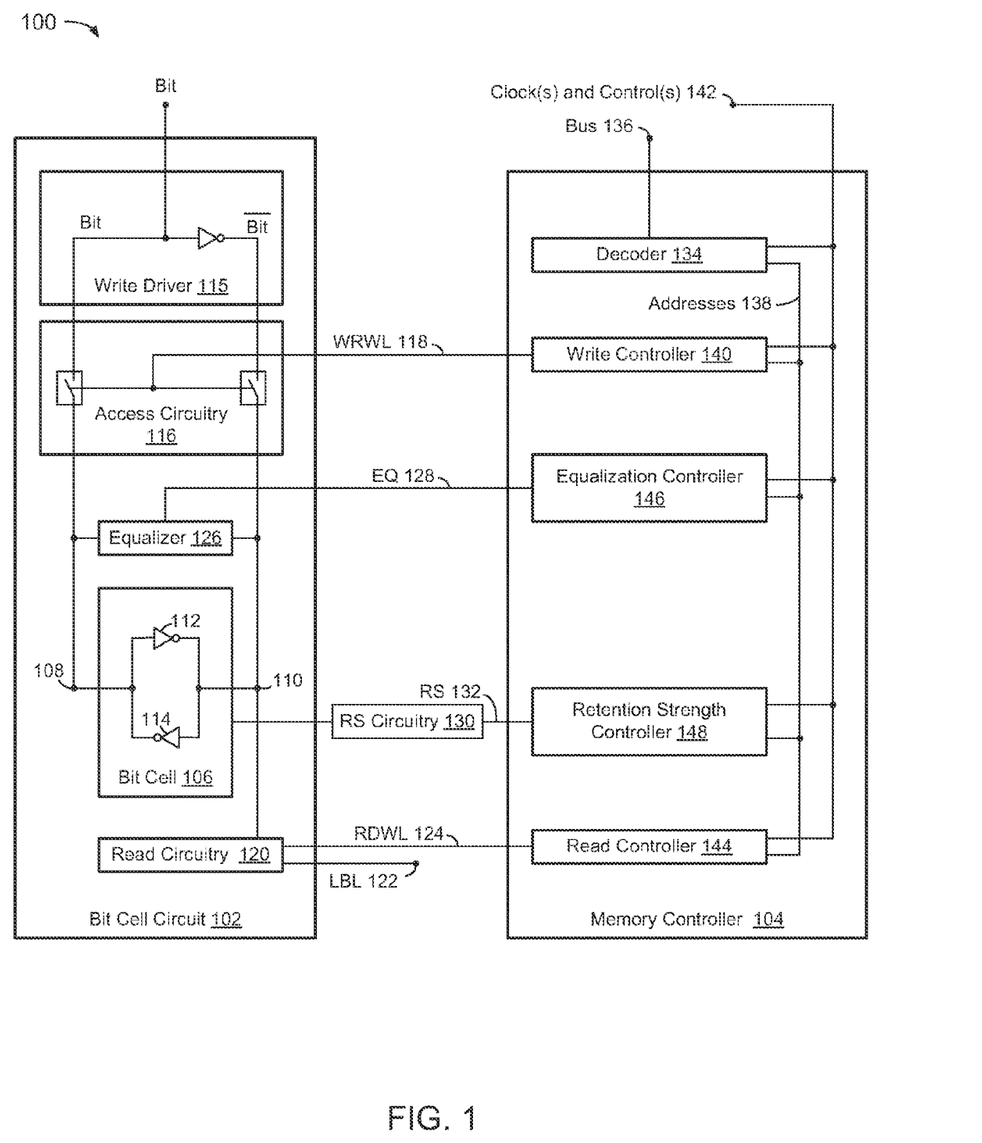
FIG. 1 is a block diagram of a memory system, including a bit cell, an equalizer to equalize a voltage difference between storage nodes of the bit cell, retention circuitry to control a retention strength of the bit cell, and a controller to initiate equalization and retention strength reduction prior to a write operation.

FIG. 1 is a block diagram of a memory system 100, including a bit cell circuit 102 and a controller, illustrated here as a memory controller 104.

Bit cell circuit 102 includes a bit cell 106, having first and second storage nodes 108 and 110, respectively.

Bit cell circuit 102 may include a write driver 115 and access circuitry 116 to present or write a logic state Bit to storage node 108, and an opposing logic state $\overline{Bit}$ to storage node 110, under control of a write wordline (WRWL) 118. Alternatively, write driver 115 may be shared amongst bit cell circuits of multiple entries. Bit and $\overline{Bit}$ may also be referred to herein as true and complimentary logic states, respectively.

Bit cell 106 may include read circuitry 120 to output a logic state of storage node 108 and/or storage node 110, under control of a read wordline (RDWL) 124. RDWL 124 and WRWL 118 may represent the same signal. Read circuitry 120 may be implemented to output a logic state of storage node 108 and/or storage node 110, illustrated here as read output LBL 122.

Controller 104 may include an address decoder 134 to decode addresses 138 from an input 136, which may represent a communication bus, such as an address bus.

Controller 104 may include a write controller 140 to assert WRWL 118 during a write period when a decoded address 138 corresponds to the bit cell 106. The write period may be determined or defined with reference to one or more clocks and/or controls 142.

The term "assert" is used herein to refer to a change in state of a signal or control. Assertion may refer to a change in state from a logic 0 to a logic 1, or from a logic 1 to a logic 0, depending upon a context.

Controller 104 may include a read controller 144 to assert RDWL 124 during a read period when a decoded address 138 corresponds to bit cell 106. The read period may be determined or defined with reference to one or more clocks and/or controls 142.

Bit cell 106 may include retention circuitry to maintain true and complimentary logic states, or opposing logic states, at storage nodes 108 and 110. In FIG. 1, retention circuitry is illustrated as opposing inverters 112 and 114. Inverter 112 may assert and/or maintain a logic state at storage node 108 that is opposite of a logic state of node 110. Similarly, inverter 114 may assert and/or maintain a logic state at storage node 110 that is opposite of the logic state of node 108.

Where existing logic states at nodes 108 and 110 are to be overwritten by corresponding opposing logic states, contention may arise between access circuitry 116 and retention circuitry of bit cell 102. The contention may be overcome where access circuitry 116 writes or presents logic states Bit and $\overline{Bit}$ to bit cell 106 with a voltage swing, or voltage difference that is at least equal to an operating voltage, or Vcc, of bit cell 106.

Alternatively, or additionally, the contention may be overcome with one or more write-assist features disclosed herein. One or more write-assist features described herein may permit bit cell circuit 102, access circuitry 116 to write Bit and $\overline{Bit}$ to bit cell 106 with a voltage swing that may be significantly less than Vcc, which may provide a relatively fast write response time.

Write-assist features may include equalization and/or retention strength control, as described below.

Bit cell circuit 102 may include an equalizer 126 to at least partially equalize a voltage difference between storage nodes 108 and 110.

Equalizer 126 may be implemented to utilize existing charge at one or more of storage nodes 108 and 110, to equalize storage nodes 108 and 110.

Equalizer 126 may include a pulse-controllable switch device and/or a controllable resistance.

Equalizer 126 may include a transistor device, and may be controllable with an equalization control (EQ) 128.

Controller 104 may include an equalization controller 146 to generate EQ 128.

An extent of equalization between nodes 108 and 110 may be a function of a duration or pulse-width of EQ 128, and/or a magnitude of EQ 128. The extent of equalization may also be a function of a process fabrication technology of bit cell 106, and/or an operating voltage of bit cell 106.

Equalization controller 146 may be configurable and/or programmable with respect to the duration and/or magnitude of EQ 128, such as to control the extent of equalization and/or to scale with respect to process fabrication technologies and/or operating voltages.

Equalization controller 146 may be implemented assert EQ 128 for a relatively short duration prior to a write operation.

Memory system 100 may include retention strength (RS) circuitry 130 to control a retention strength bit cell 106. RS circuitry 130 may be controllable with a retention strength control (RS) 132. RS circuitry 130 may be implemented, for example, to control a voltage supply or source provided to inverters 112 and 114, such as Vcc and/or Vss.

Controller 104 may include a retention strength (RS) controller 148 to generate RS 132.

RS controller 148 may be implemented to control RS circuitry 130 to reduce the retention strength of bit cell 106 prior to and during equalization. RS controller 148 may be implemented to maintain the reduced retention strength during at least a portion of a subsequent write operation.

An equalizer and equalization controller may be collectively referred to herein as an equalization system.

A retention strength circuit and a retention strength controller may be collectively referred to herein as a retention strength control system.

An equalizer system and/or a retention strength control system may be implemented alone or in combination with one another.

Bit cell circuit 102 and/or RS circuitry 130 may be implemented as described below with reference to FIG. 2.

Figure 2:
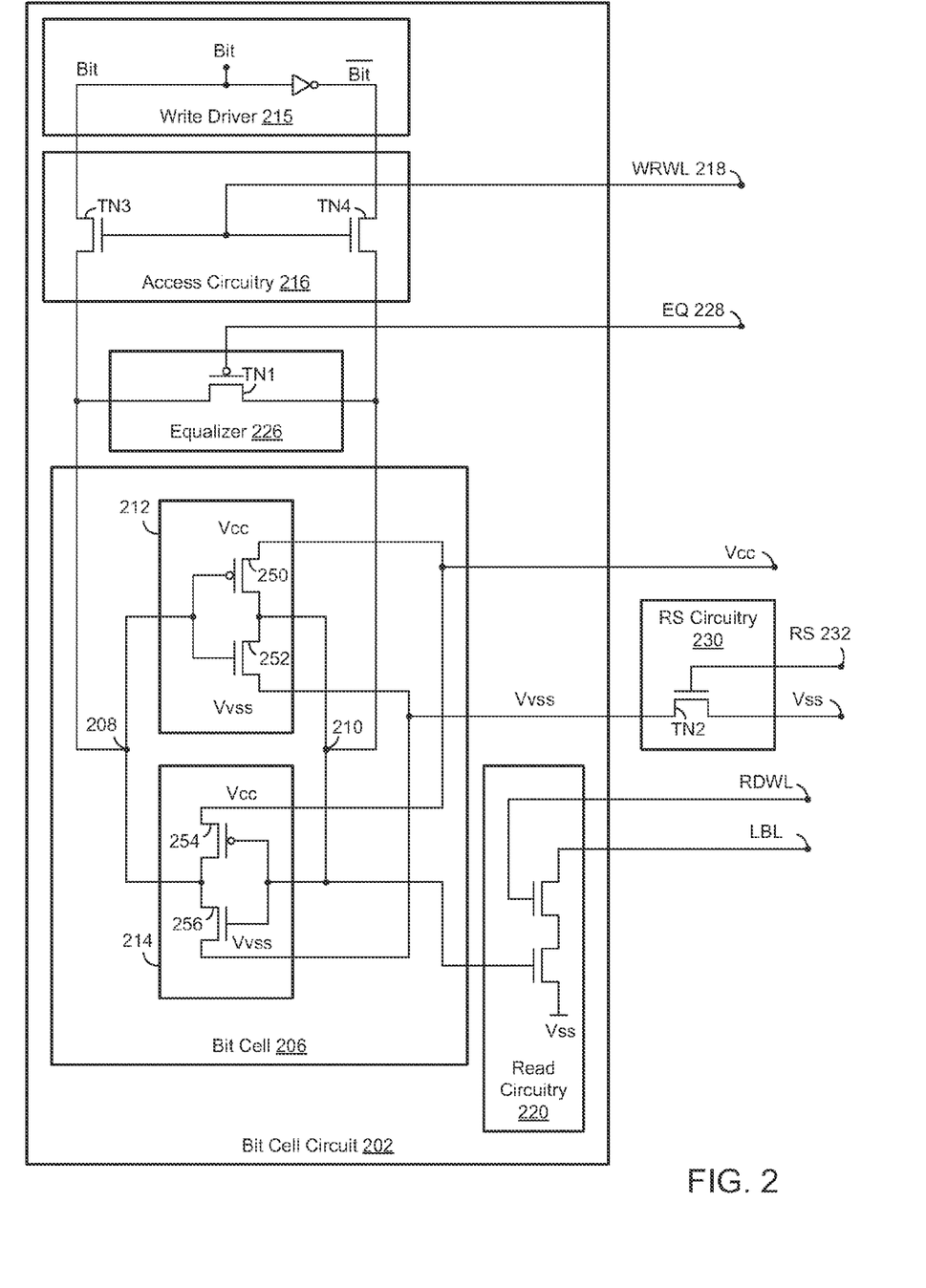
FIG. 2 is a circuit diagram of a bit cell and retention strength circuitry.

FIG. 2 is a circuit diagram of a bit cell circuit 202 and RS circuitry 230.

Bit cell circuit 202 includes a bit cell 206, write driver 215, access circuitry 216, read circuitry 220, and an equalizer 226.

Bit cell 206 includes storage nodes 208 and 210, and inverters 212 and 214 to maintain opposing logic states at storage nodes 208 and 210. In FIG. 2, inverter 212 includes a p-type device 250 and an n-type device 252. Similarly, inverter 214 includes a p-type device 254 and an n-type device 256. Source terminals of p-type devices 250 and 254 are coupled to a voltage rail, illustrated here as Vcc. Drains of n-type devices 252 and 256 are controllably coupled to a source, illustrated here as Vss, through RS circuitry 230.

Bit cell 206 is described below for an example where a logic value of 0 is, or has been written to storage node 208, and a logic value of 1 is, or has been written to storage node 210. The logic values of 0 and 1 may correspond to Vss and Vcc, respectively.

Regarding inverter 212, a logic state of 0 at storage node 208 turns-on p-type device 250 and turns off n-type device 252. In this situation, p-type device 250 asserts Vcc at storage node 210, and n-type device 250 essentially isolates storage node 210 from Vss. Inverter 212 thus asserts a logic state of 1 at storage node 210 based on the logic state of 0 at node 208.

Regarding inverter 214, a logic state of 1 at storage node 210 turns off p-type 254 and turns on n-type device 256. In this situation, p-type device 254 essentially isolates node 208 from Vcc, and n-type device 256 asserts Vss at node 208. Inverter 214 thus asserts a logic state of 0 at storage node 208 based on the logic state of 1 at node 210.

Inverters 212 and 214 thus assert opposing logic states at nodes 208 and 210.

Access circuitry 216 may include first and second access transistors TN3 and TN4, respectively. When a write wordline (WRWL) 218 is asserted, transistors TN3 and TN4 present, or write corresponding logic states Bit and $\overline{Bit}$ to first and second storage nodes 208 and 210.

In FIG. 2, access transistors TN3 and TN4 are illustrated as n-type devices, in which case, assertion of WRWL 218 corresponds to a logic state of 1. Access circuitry 216 is not, however, limited to the example of FIG. 2.

Equalizer 226 may include a write-assist transistor TN1, having source and drain nodes, each coupled to one of storage nodes 108 and 110. A gate of write-assist transistor TN1 may be controlled by an equalization control (EQ) 228. When EQ 228 is asserted, charge may flow through write-assist transistor TN1 to reduce a voltage difference between storage nodes 208 and 210.

In FIG. 2, write-assist transistor TN1 is illustrated as a p-type device, in which case, assertion of EQ 228 corresponds to a logic state of 0. Equalizer 226 is not, however, limited to the example of FIG. 2. Write assist transistor TN1 may, for example, be implemented with an n-type device, such as an n-type field effect transistor (FET), and/or a combination of n-type and p-type devices.

A controller, such as controller 104 in FIG. 1, may be implemented to assert EQ 228 prior to a write operation and for a time sufficient to partially or fully equalize storage nodes 208 and 210.

Full equalization may preclude recovery of pre-existing logic states at storage nodes 208 and 210. Full equalization may be suitable, for example, where EQ 128 is asserted with respect to a bit cell, or bit cells, to which a corresponding write operation is directed.

Partial equalization may be suitable, for example, where EQ 228 is shared amongst multiple bit cells, to equalize the multiple bit cells when a write operation is directed to a subset of the bit cells, such as described below with respect to FIGS. 5, 6, and 7.

In FIG. 2, RS circuitry 230 may include a transistor TN2 having source and drain nodes to controllably couple the drain nodes of n-type devices 252 and 256 to Vss, under control of RS 232. When RS 232 is high, the drain nodes of devices 252 and 256 are coupled to Vss to maintain retention strength of bit cell 206. When RS 232 is asserted low, the drain nodes of devices 252 and 256 are de-coupled from Vss to float. An output of RS circuitry 230 may be referred to herein as a virtual Vss (Vvss).

When the drain nodes of devices 252 and 256 float, and at least until EQ 228 is asserted, storage nodes 208 and 210 may retain pre-existing logic states, but with less strength or ability to resist a change.

An example write-assist process is provided below with reference to FIGS. 3 and 4, in which write assistance is provided to a bit cell to which a write operation is directed.

Figure 3:
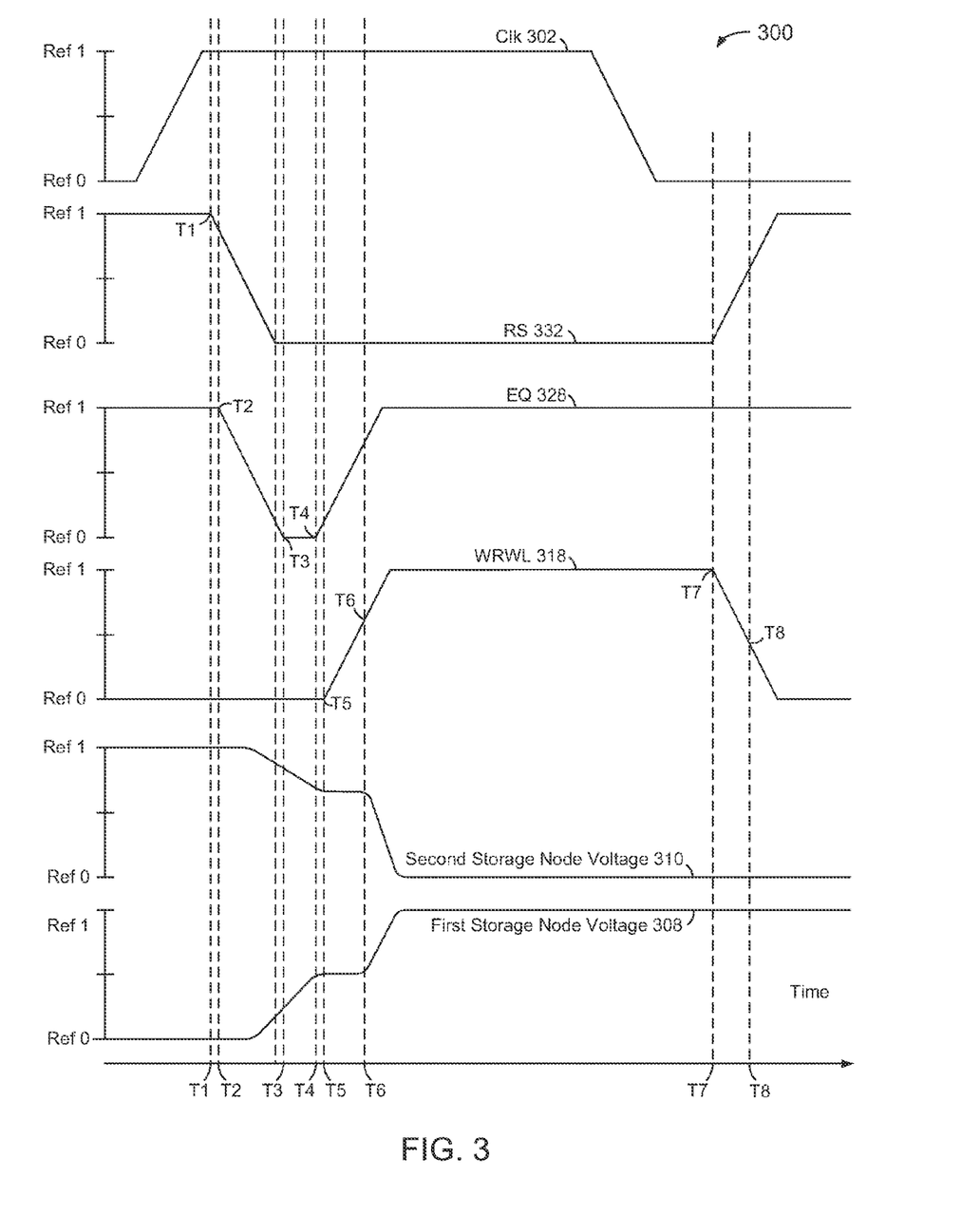
FIG. 3 is a write-assist timing diagram for a bit cell to which a write operation is directed.

FIG. 3 is a write-assist timing diagram 300 for a bit cell to which a write operation is directed.

Timing diagram 300 includes a clock 302, a retention strength control (RS) 332, an equalizer control (EQ) 328, a write wordline (WRWL) 318, a first storage node voltage 308 and a second storage node voltage 310. RS 332, EQ 328, WRWL 318, may correspond to RS 132, EQ 128, and WRWL 118 in FIG. 1, and/or RS 232, EQ 228, and WRWL 218 in FIG. 2. First and second storage node voltages 308 and 310 may correspond to storage nodes 108 and 110 in FIG. 1, and/or storage nodes 208 and 210 in FIG. 2.

In timing diagram 300, amplitudes are illustrated with respect to Ref 0 and Ref 1, which may correspond to logic states of 0 and 1, respectively, and which may correspond to Vss and Vcc, respectively, in FIG. 2.

Timing diagram 300 illustrates an example in which existing logic states of 0 and 1 are over-written with logic states of 1 and 0, respectively.

Figure 4:
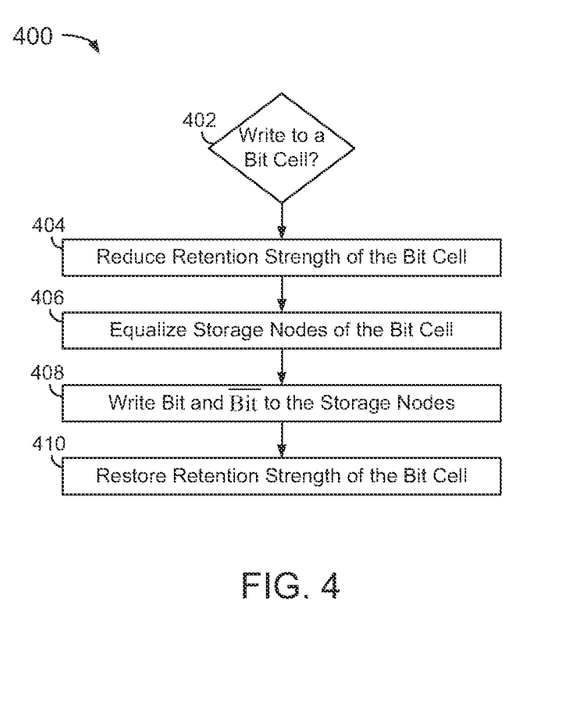
FIG. 4 is a flowchart of a method of providing write assistance to a bit cell.

FIG. 4 is a flowchart of a method 400 of providing write assistance to a bit cell. Method 400 is described below with reference to FIGS. 1, 2, and 3. Method 400 is not, however, limited to the examples of FIG. 1, 2, or 3.

At 402, where a write operation is to be performed on a bit cell, processing proceeds to 404.

At 404, retention strength of the bit cell is reduced prior to the write operation.

In FIG. 1, retention strength of bit cell 106 may be reduced with assertion of RS 132.

In FIG. 2, retention strength of bit cell 206 may be reduced with assertion of RS 232.

In FIG. 3, RS 332 is asserted at T1.

At 406, the first and second storage nodes of the bit cell are equalized prior to the write operation.

In FIG. 1, storage nodes 108 and 110 may be equalized with assertion of EQ 128.

In FIG. 2, storage nodes 208 and 210 may be equalized with assertion of EQ 228.

In FIG. 3, EQ 328 is asserted at T2, just after assertion of RS 332, and is de-asserted at T4, just prior to assertion of WRWL 318 at T5. Between T3 and T4, EQ 328 and RS 332 are fully asserted and first and second node voltages 308 and 310 increasingly equalize with respect to one another. In this example, voltage 308 increases towards Ref 1 and voltage 310 decreases towards Ref 0.

At 408, logic states Bit and $\overline{Bit}$ are written to the bit cell.

In FIG. 1, WRWL 118 may be asserted to write Bit and $\overline{Bit}$ to storage nodes 108 and 110, respectively.

In FIG. 2, WRWL 218 may be asserted to write Bit and $\overline{Bit}$ to storage nodes 208 and 210, respectively.

In FIG. 3, first and second storage node voltages 308 and 310 are initially at Ref 0 and Ref 1, respectively, which may correspond to respective logic states of 0 and 1. At T5, WRWL 318 is asserted to overwrite the pre-existing logic states with logic states of 1 and 0, respectively. As WRWL 318 becomes active at approximately T6, first storage node voltage 308 increases until it attains a steady state of Ref 1, and second storage node voltage 310 decreases until it attains a steady state of Ref 0. At T7, WRWL 318 is de-asserted.

At 408, the retention strength of the bit cell is reinstated. The retention strength may be reinstated subsequent to writing at 408.

In FIG. 1, RS 132 may be de-asserted.

In FIG. 2, RS 232 may be de-asserted.

In FIG. 3, RS 332 is de-asserted at approximately T7. Thereafter, the bit cell maintains first and second storage node voltages 308 and 310 at the corresponding steady state voltages, or logic states.

One or more write-assist features disclosed herein may be implemented across, or shared amongst multiple bit cells, such as described below with reference to FIG. 5 and/or FIG. 6.

Figure 5:
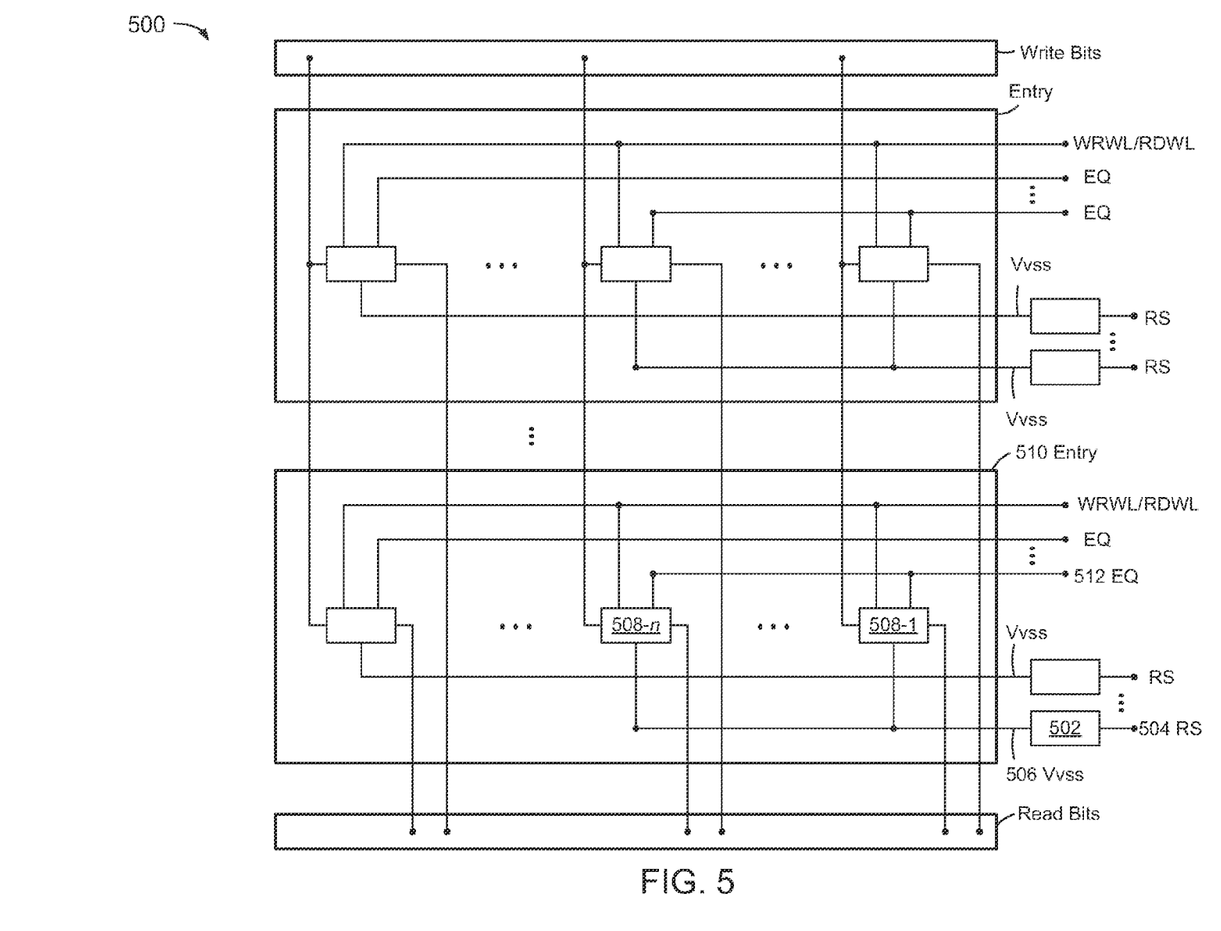
FIG. 5 is a block diagram of a memory system to share an equalization control, retention strength circuit, and a retention strength control amongst multiple bit cell circuits of an entry or word-line.

FIG. 5 is a block diagram of a memory system 500 to share an equalization control, a retention strength circuit, and a retention strength control amongst multiple bit cell circuits of an entry or word-line.

Memory system 500 may include an array of bit cell circuits, accessible as word-lines or entries. Each of the bit cell circuits, or a subset thereof, may include an equalizer as described in one or more examples herein.

Memory system 500 may include a retention strength circuit 502 to receive a retention strength control RS 504, and output Vvss 506, such as described in one or more examples herein.

Vvss 506 may be provided to, or shared amongst multiple bit cell circuits of an entry. In FIG. 5, Vvss 506 is shared amongst bit cell circuits 508-1 through 508-n of an entry 510. RS 504 may be asserted to reduce retention strengths of bit cell circuits 508-1 through 508-n when a write a write operation is directed to entry 510.

Memory system 500 may include one or more additional EQ controls to equalize one or more additional sets of bit cell circuits of entry 502 and/or other entries.

Memory system 500 may include an equalization control (EQ) 512, which may be provided to, or shared amongst multiple bit cell circuits of an entry. In FIG. 5, EQ 512 is shared amongst bit cell circuits 508-1 through 508-n of entry 510. EQ 512 may be asserted to equalize storage nodes of bit cell circuits 508-1 through 508-n when a write a write operation is directed to entry 510.

Memory system 500 may include one or more additional retention strength circuits to control retention strengths of one or more additional sets of bit cell circuits of entry 510, and/or other entries. Each RS circuit may receive a dedicated RS control. Alternatively, one or more RS controls may be shared amongst multiple RS circuits.

Figure 6:
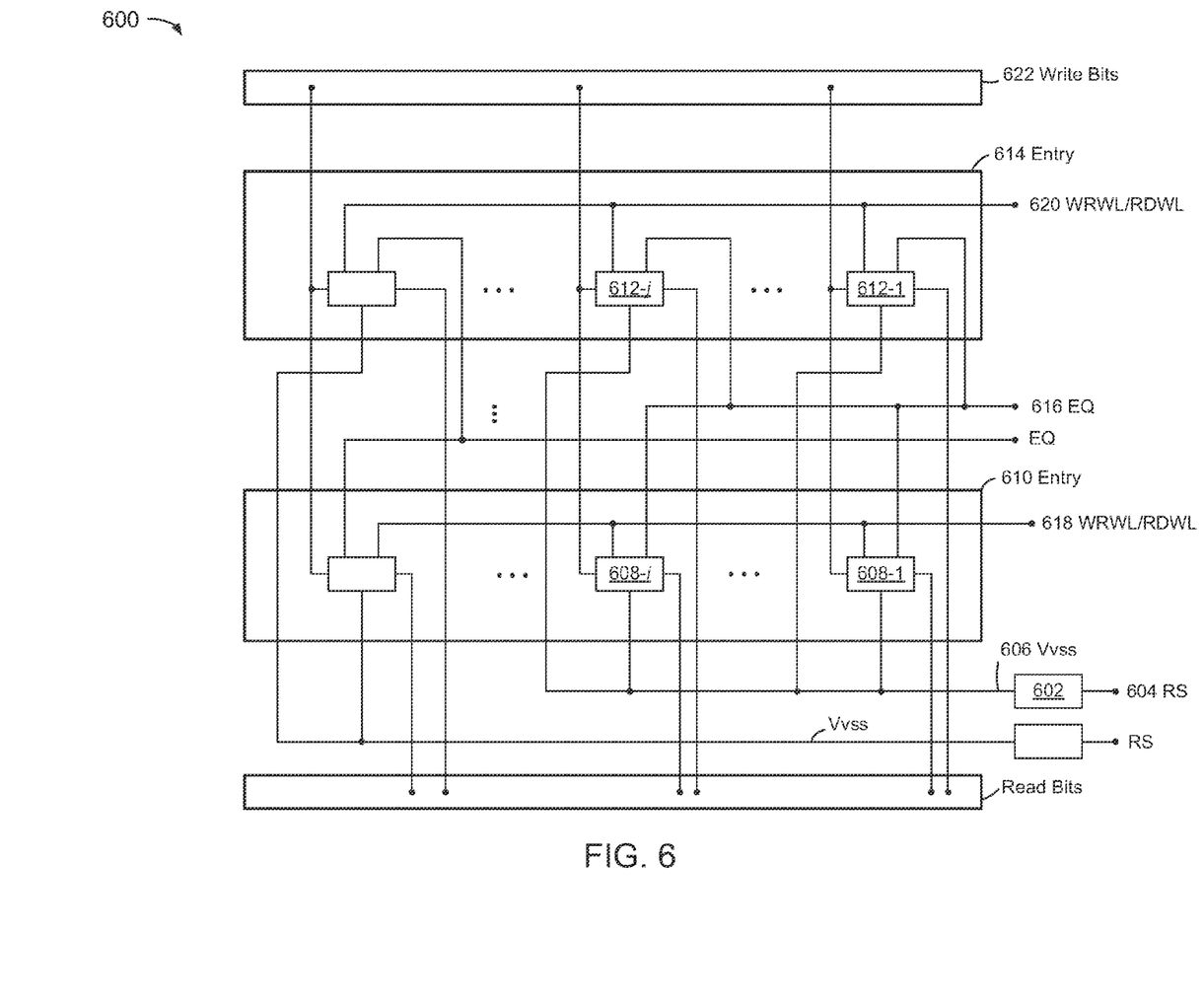
FIG. 6 is a block diagram of a memory system to share an equalization control, a retention strength circuit, and a retention strength control amongst bit cell circuits of multiple entries or word-lines.

FIG. 6 is a block diagram of a memory system 600 to share an equalization control, a retention strength circuit, and a retention strength control across multiple entries.

Memory system 600 may include a retention strength circuit 602 to receive a retention strength control RS 604, and output Vvss 606, such as described in one or more examples herein.

Vvss 606 may be provided to, or shared amongst one or more bit cell circuits of multiple entries. In the example of FIG. 6, Vvss 606 is shared amongst bit cell circuits 608-1 through 608-i of an entry 610, and bit cell circuits 612-1 through 612-j of an entry 614. In FIG. 6, i and j may be equal or unequal to one another.

RS 604 may be asserted to reduce retention strengths of bit cell circuits 608-1 through 608-i and 612-1 through 612-j, when a write a write operation is directed to either of entries 610 and 614.

Memory system 600 may include an equalization control (EQ) 616, which may be provided to, or shared amongst one or more bit cell circuits of multiple entries. In the example of FIG. 6, EQ 616 is shared amongst bit cell circuits 608-1 through 608-i and 612-1 through 612-j. EQ 616 may be asserted to equalize storage nodes of bit cell circuits 608-1 through 608-i and 612-1 through 612-j, when a write a write operation is directed to either of entries 610 and 614.

Memory system 600 may be implemented to control EQ 602 such that bit cells that are not written to during a write operation ("unwritten bit cells"), retain existing logic states subsequent to the write operation. For example, when a write operation is directed to entry 614, RS 604 and EQ 616 may be asserted to assist the write operation. In this example, bit cell circuits 608-1 through 608-i of entry 610 are referred to as unwritten bit cells.

Memory system 600 may be implemented to control EQ 616 such that bit cell circuits 608-1 through 608-i are able to retain existing logic states subsequent to the write operation directed to entry 614. For example, a duration and/or magnitude of EQ 616 may be configured to only partially equalize the bit cell circuits, such as described in one or more examples herein.

In the example above, where a write operation is directed to entry 614, one or more additional equalizer controls and/or RS controls may be asserted to provide write assistance to one or more additional bit cell circuits of entry 614.

An example write-assist process is described below with reference to FIGS. 7 and 8, and with respect to an unwritten bit cell.

Figure 7:
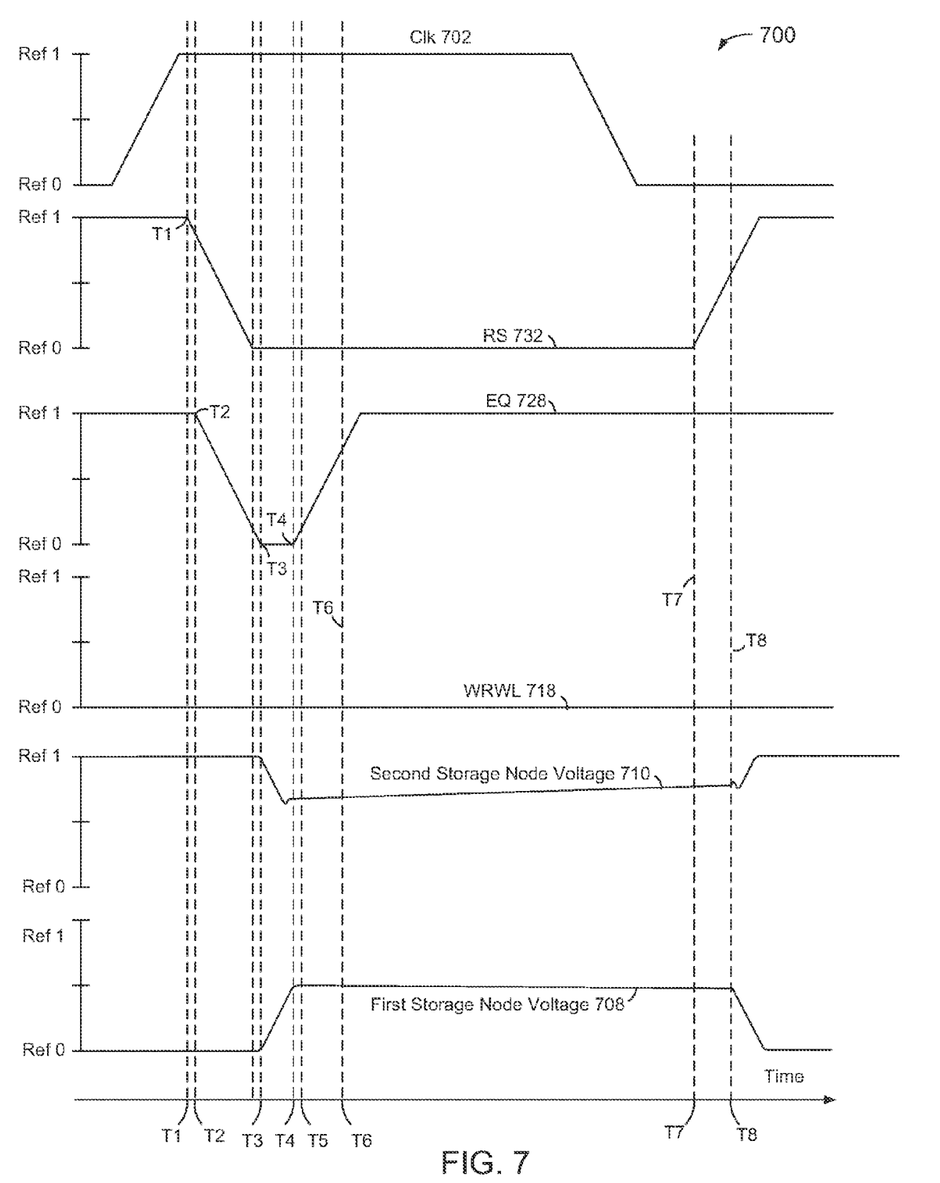
FIG. 7 is a write-assist timing diagram for an unwritten bit cell.

FIG. 7 is a write-assist timing diagram 700 of an unwritten bit cell. Timing diagram 700 is described below with respect to bit cell circuit 608-1 of entry 610 in FIG. 6, for a situation where a write operation is directed to entry 614.

Timing diagram 700 includes a clock 702, a retention strength control (RS) 732, an equalizer control (EQ) 728, a write wordline (WRWL) 718, a first storage node voltage 708 and a second storage node voltage 710. For the example below, RS 732, EQ 728, WRWL 718, may correspond to RS 604, EQ 616, and WRWL/RDWL 618 in FIG. 6. First and second storage node voltages 708 and 710 may correspond to storage nodes of bit cell circuit 608-1 in FIG. 6.

In timing diagram 700, amplitudes are illustrated with respect to Ref 0 and Ref 1, which may correspond to logic states of 0 and 1, respectively.

Figure 8:
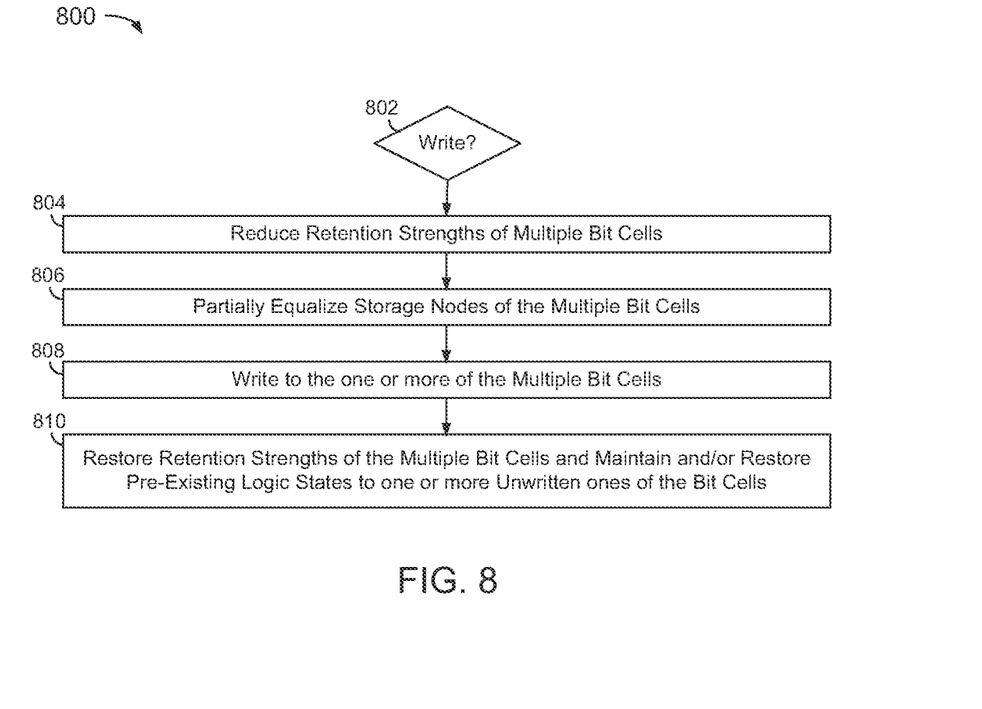
FIG. 8 is a flowchart of a method of providing write assistance to multiple bit cell circuits, such as when a write operation is directed to a subset of the multiple bit cell circuits.

FIG. 8 is a flowchart of a method 800 of providing write assistance to multiple bit cell circuits, such as when a write operation is directed to a subset of the multiple bit cell circuits. Method 800 is described below with reference to FIGS. 6 and 7. Method 800 is not, however, limited to the examples of FIGS. 6 and 7.

At 802 in FIG. 8, when a write operation is to be performed, processing proceeds to 804. The write operation may be directed to multiple bit cells, such as entry 614 in FIG. 6.

At 804, retention strength is reduced in each of multiple bit cells prior to the write operation. The multiple bit cells may include bit cells to which the write operation is directed, and other bit cells, or unwritten bit cells.

In FIG. 6, RS 604 may be asserted to reduce retention strengths of bit cell circuits 612-1 through 612-j of entry 614, and bit cell circuits 608-1 through 608-i of entry 610. One or more additional RS controls may be asserted to reduce retention strengths of one or more additional bit cell circuits of entry 614.

In FIG. 7, RS 732 is asserted at T1.

At 806, storage nodes of each of the multiple bit cells are partially equalized prior to the write operation.

In FIG. 6, EQ 616 may be asserted for a time sufficient to partially equalize storage nodes of 612-1 through 612-j of entry 614, and 608-1 through 608-i of entry 610. One or more additional equalizer controls may be asserted to equalize one or more other bit cell circuits of entry 614.

Partial equalization may permit sufficient charge to remain at storage nodes of unwritten bit cell circuits 608-1 through 608-i, to permit the unwritten bit cell circuits to maintain and/or restore pre-existing logic states subsequent to the write operation, such as described below with respect to 810.

In FIG. 7, EQ 728 is asserted at T2, just after assertion of RS 732, and may be de-asserted at T4. Between T3 and T4, EQ 728 and RS 732 are fully asserted and first and second node voltages 708 and 710 partially equalize with respect to one another.

At 808, the write operation is performed.

In FIG. 6, WRWL/RDWL 620 may be asserted to write bits 622 to bit cell circuits of entry 614.

In FIG. 7, WRWL 718 represents a wordline of an unwritten bit cell, and is not asserted. WRWL 718 may correspond to WRWL/RDWL 618 in FIG. 6.

At 810, the retention strengths are restored to the bit cells, and pre-existing logic states are maintained and/or restored at one or more unwritten bit cells.

In FIG. 6, RS 604 may be de-asserted.

In FIG. 7, RS 732 is de-asserted at T7.

Regarding restoration of pre-existing logic states, in FIG. 7, during equalization between T3 and T4, voltage 708 increases from Ref 0, and voltage 710 decreases from Ref 1. Voltages 708 and 710 do not, however, fully equalize with respect to one another. Rather, pre-existing logic states remain discernable from voltages 708 and 710 throughout the assertion of RS 732, such that the corresponding logic states are restored upon de-assertion of RS 732 at T7. Partial equalization thus maintains sufficient charge at nodes of an unwritten bit cell to maintain and/or restore pre-existing logic states to the unwritten cell.

A memory system as disclosed herein may be implemented to provide a write address to a write-assistance controller, such as equalization controller 146 and retention strength controller 148 in FIG. 1, in advance of a write operation to permit application of write-assistance prior to the write operation.

The memory system may be implemented, for example, to decode a bit cell address sufficiently in advance of the write operation.

The memory system may be implemented to decode a portion of an address in advance of a write operation, and apply write-assistance to multiple bit cells that share the decoded portion of the address, such as described above with reference to FIG. 5 and/or FIG. 6.

Alternatively, or additionally, the memory system may be implemented to delay the write operation to permit application of write-assistance prior to the write operation.

One or more features disclosed herein may be implemented in hardware, software, firmware, and combinations thereof, including discrete and integrated circuit logic, application specific integrated circuit (ASIC) logic, and microcontrollers, and may be implemented as part of a domain-specific integrated circuit package, and/or a combination of integrated circuit packages.

Figure 9:
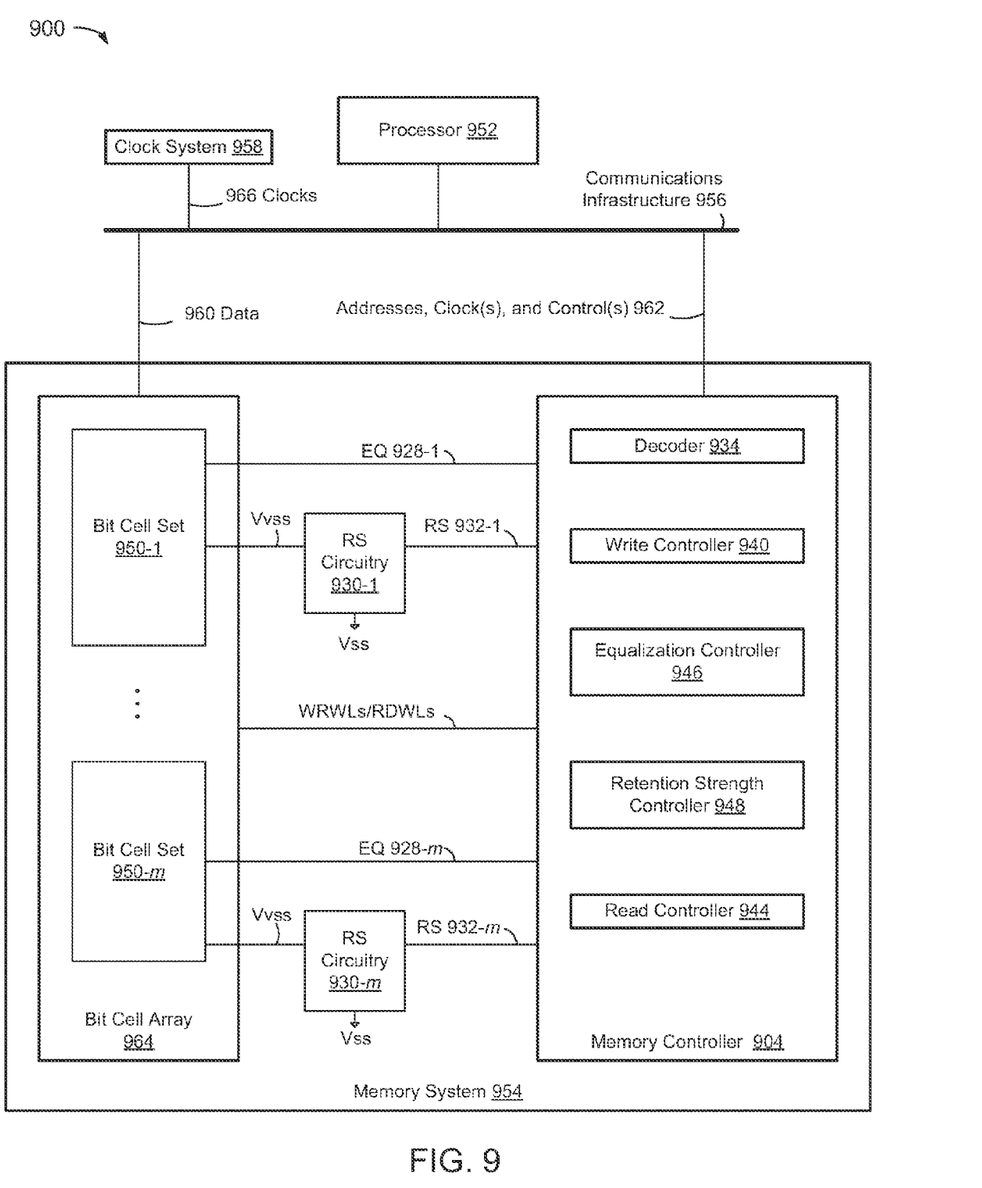
FIG. 9 is a block diagram of a computer system, including a processor and a memory system to provide write-assistance to multiple bit cells.

FIG. 9 is a block diagram of a computer system 900, including a processor 952 and a memory system 954 accessible to processor 952.

Memory system 964 may include a bit cell array 964, which may include bit cell circuits as described in one or more examples herein.

Memory system 954 may include a memory controller 904, which may include one or more of a decoder 934 to decode addresses and/or partial addresses, such as describe in one or more examples herein.

Memory system 954 may further include a write controller 940 and a read controller 944, such as described in one or more examples above. Write controller 940 and read controller 944 may correspond to a single system Memory system 964 may include one or more write assistance features disclosed herein, and may be implemented to apply one or more write-assistance features to one or more sets 950 of bit cell circuits.

For example, bit cells within a set 950 may each include an equalizer, and memory controller 904 may include an equalizer controller 946 to equalize each bit cell within a bit cell set 950 prior to write operation directed to one or more bit cells within the set. Equalizer controller 946 may provide an equalizer control (EQ) 928 for each bit cell set 950.

Memory system 964 may include an RS circuit 930 for each bit cell set 950, and memory controller 904 may include a retention strength controller 948 to reduce contention strengths of each bit cell within a bit cell set 950 prior to a write operation directed to one or more bit cells within the set. Retention strength controller 948 may provide a retention strength control (RS) 932 for each bit cell set 950.

Where bit cell array is addressable by entries, or wordlines, a bit cell set 950 may include bit cells of a single entry, such as described above with reference to FIG. 5, or may include bit cells of multiple entries such as described above with reference to FIG. 6.

Equalization controller 946 may be hardware and/or software configurable, or programmable to control a duration and/or amplitude of EQs 928-1 through 928-*m*, and may be configurable with respect to one or more individual ones of EQs 928-1 through 928-*m*.

The terms software, code, and instructions, as used herein, may refer to a computer program product including a computer readable medium having computer program logic stored therein, which may include instructions to cause a computer system to perform one or more functions in response thereto. The computer readable medium may include a transitory and/or non-transitory medium.

Computer system 900 may include a clock system to generate, derive, and/or synthesize one or more clocks 966.

Computer system 900 may include a communications infrastructure 956 to provide one or more communication channels amongst devices of computer system 900, including between processor 952 and memory system 954, such as to communicate data 960 to and from memory system 954, and/or to provide one or more of addresses, clocks, and controls 962 to memory system 954.

Methods and systems are disclosed herein with the aid of functional building blocks illustrating the functions, features, and relationships thereof. At least some of the boundaries of these functional building blocks have been arbitrarily defined herein for the convenience of the description. Alternate boundaries may be defined so long as the specified functions and relationships thereof are appropriately performed.

While various embodiments are disclosed herein, it should be understood that they have been presented by way of example only, and not limitation. It will be apparent to persons skilled in the relevant art that various changes in form and detail may be made therein without departing from the spirit and scope of the methods and systems disclosed herein. Thus, the breadth and scope of the claims should not be limited by any of the example embodiments disclosed herein.

What is claimed is:

1. A system, comprising:
a bit cell including first and second storage nodes and retention circuitry to assert opposing logic states at the first and second storage nodes;
a retention strength control system to reduce a retention strength of the bit cell prior to a write operation; and
an equalizer system to at least partially equalize voltages at the first and second storage nodes with respect to one another prior to the write operation;
wherein the retention strength control system includes a retention strength controller to assert a retention strength reduction control prior to the write operation; and
wherein the equalizer system includes an equalization controller to assert an equalizer control subsequent to assertion of the retention strength reduction control, and de-assert the equalizer control prior to the write operation.

2. The system of claim 1, wherein the equalizer system is configurable to control an extent of equalization.

3. The system of claim 1, wherein the equalizer system further includes:
a circuit to provide a charge transfer path between the first and second storage nodes under control of the equalizer control.

4. The system of claim 3, wherein the equalization controller is configurable with respect to one or more of a magnitude and duration of the equalizer control.

5. The system of claim 1, wherein the retention strength control system further includes a controllable power interrupt circuit coupled to the bit cell and to a power supply node.

6. The system of claim 1, wherein:
the retention strength control system is configured to reduce retention strengths of each of multiple bit cells prior to a write operation directed to a subset of the multiple bit cells; and
the equalizer system configured to partially equalize each of the multiple bit cells prior to the write operation directed to the subset of the multiple bit cells.

7. The system of claim 1, wherein the retention strength control system is configured to permit first and second opposing logic states to be written to the bit cell when a voltage swing of the first and second opposing logic states is less than an operating voltage of the bit cell.

8. A system, comprising:
a processor; and
a memory system that includes,
an array of bit cells, each including first and second storage nodes and retention circuitry to assert opposing logic states at the first and second storage nodes;
a memory controller to interface with the processor and to write and read data to and from the array of bit cells;
a retention strength control system to reduce retention strengths of each of multiple ones of the bit cells prior to a write operation; and
an equalizer control system to at least partially equalize voltages at the first and second storage nodes of each of the multiple bit cells prior to the write operation;
wherein the retention strength control system includes a retention strength controller to assert a retention strength reduction control prior to the write operation; and
wherein the equalizer system includes an equalization controller to assert an equalizer control subsequent to assertion of the retention strength reduction control, and de-assert the equalizer control prior to the write operation.

9. The system of claim 8, wherein the equalizer system is configurable to control an extent of equalization.

10. The system of claim 8, wherein the equalizer system further includes:
a circuit to provide a charge transfer path between the first and second storage nodes under control of an equalizer control.

11. The system of claim 10, wherein the equalization controller is configurable with respect to one or more of a magnitude and duration of the equalizer control.

12. The system of claim 8, wherein the retention strength control system further includes a controllable power interrupt circuit coupled to the retention circuitry of each of the multiple bit cells and to a power supply node.

13. The system of claim 8, wherein the retention strength control system is configured to permit first and second opposing logic states to be written to a bit cell when a voltage swing of the first and second opposing logic states is less than an operating voltage of the bit cell.

14. The system of claim 8, wherein:
the retention strength control system is configured to reduce retention strengths of each of the multiple bit cells prior to a write operation directed to a subset of the multiple bit cells; and
the equalizer control system is configured to partially equalize each of the multiple bit cells prior to the write operation directed to the subset of the multiple bit cells.

15. A method, comprising:
reducing a retention strength of a bit cell prior to a write operation;
at least partially equalizing voltages at first and second storage nodes of the bit cell prior to the write operation;

writing opposing logic states to the first and second storage nodes; and restoring the retention strength of the bit cell;

wherein the reducing a retention strength includes interrupting a power source of the bit cell prior to the writing; and the at least partially equalizing includes at least partially equalizing the first and second storage nodes subsequent to the reducing a retention strength and prior to the writing, and halting the at least partially equalizing prior to the writing.

16. The method of claim 15, wherein the at least partially equalizing further includes:

enabling a charge transfer path between the first and second terminals for a configurable period of time.

17. The method of claim 15, wherein the at least partially equalizing further includes:

controlling an extent of equalization.

18. The method of claim 15, wherein the at least partially equalizing further includes:

asserting an equalizer control at a configurable magnitude and/or for a configurable duration.

19. The method of claim 15, wherein:

the reducing a retention strength further includes reducing retention strengths of each of multiple bit cells when the write operation is directed to a subset of the bit cells; and the at least equalizing further includes at least partially equalizing each of the multiple bit cells when the write operation is directed to the subset of the bit cells.

\* \* \* \* \*